United States Patent
Braganca

(10) Patent No.: US 9,837,602 B2
(45) Date of Patent: Dec. 5, 2017

(54) SPIN-ORBIT TORQUE BIT DESIGN FOR IMPROVED SWITCHING EFFICIENCY

(71) Applicant: Western Digital Technologies, Inc., Irvine, CA (US)

(72) Inventor: Patrick M. Braganca, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 33 days.

(21) Appl. No.: 14/971,911

(22) Filed: Dec. 16, 2015

(65) Prior Publication Data

US 2017/0179372 A1 Jun. 22, 2017

(51) Int. Cl.
*H01L 43/02* (2006.01)
*H01L 27/22* (2006.01)
*H01L 43/08* (2006.01)
*H01L 43/10* (2006.01)

(52) U.S. Cl.
CPC ............ *H01L 43/02* (2013.01); *H01L 27/222* (2013.01); *H01L 43/08* (2013.01); *H01L 43/10* (2013.01)

(58) Field of Classification Search
None
See application file for complete search history.

(56) References Cited

U.S. PATENT DOCUMENTS

| 6,654,278 B1 * | 11/2003 | Engel ............... G11C 11/16 365/158 |
| 7,453,720 B2 | 11/2008 | Ju et al. |
| 7,903,452 B2 | 3/2011 | Dittrich et al. |
| 8,674,466 B2 | 3/2014 | Guo |
| 2004/0012056 A1 * | 1/2004 | Nejad ............... G11C 11/15 257/414 |

(Continued)

FOREIGN PATENT DOCUMENTS

CN 104393169 A 3/2015

OTHER PUBLICATIONS

Ultrafast magnetization switching by spin-orbit torques <http://www.researchgate.net/profile/Kevin_Garello/publication/258082794_Ultrafast_magnetization_switching_by_spin-orbit_torques/links/552e3c110cf2acd38cb90763.pdf>, Oct. 2013.
Evaluation of Hybrid Memory Technologies Using SOT-MRAM for On-Chip Cache Hierarchy <http://ieeexplore.ieee.org/stamp/stamp.jsp?tp=&arnumber=7008441&isnumber=7042867>, Mar. 2015.

(Continued)

*Primary Examiner* — Lex Malsawma
(74) *Attorney, Agent, or Firm* — Stoel Rives LLP

(57) ABSTRACT

A method for a non-volatile memory cell; specifically, a spin orbit torque MRAM (SOT-MRAM) memory cell which reduces the current required to switch individual bits. The memory cell includes a first interconnect line having a first longitudinal axis, an elliptically shaped MTJ bit ("bit") having a long axis, and a second interconnect line having a second longitudinal axis perpendicular to the first interconnect line. The bit includes a polarized free layer, a barrier layer, and a polarized reference layer with a magnetic moment pinned at an angle different from the long axis. By disposing the long axis at an angle relative to the first longitudinal axis and second longitudinal axis and the reference layer as described, and applying a voltage to the interconnect line, a non-zero equilibrium angle can be induced between the free layer and the spin current or the Rashba field resulting in more coherent switching dynamics.

24 Claims, 6 Drawing Sheets

(56) References Cited

U.S. PATENT DOCUMENTS

| | | | | |
|---|---|---|---|---|
| 2004/0052127 A1* | 3/2004 | Suzuki | ............ | B82Y 10/00 |
| | | | | 365/200 |
| 2004/0120184 A1* | 6/2004 | Janesky | ............ | B82Y 10/00 |
| | | | | 365/158 |
| 2004/0150016 A1* | 8/2004 | Ooishi | ............ | B82Y 10/00 |
| | | | | 257/295 |
| 2004/0246788 A1* | 12/2004 | Sone | ............ | B82Y 25/00 |
| | | | | 365/200 |
| 2005/0276099 A1* | 12/2005 | Horng | ............ | B82Y 10/00 |
| | | | | 365/158 |
| 2007/0059877 A1* | 3/2007 | Koo | ............ | H01F 10/193 |
| | | | | 438/213 |
| 2007/0278547 A1* | 12/2007 | Pietambaram | ............ | H01L 43/08 |
| | | | | 257/296 |
| 2009/0096043 A1* | 4/2009 | Min | ............ | H01L 43/12 |
| | | | | 257/421 |
| 2014/0169088 A1* | 6/2014 | Buhrman | ............ | G11C 11/18 |
| | | | | 365/158 |
| 2015/0041934 A1 | 2/2015 | Khvalkovskiy et al. | | |
| 2015/0137288 A1 | 5/2015 | Ohmori et al. | | |
| 2015/0213867 A1* | 7/2015 | Wu | ............ | G11C 11/1675 |
| | | | | 365/158 |
| 2016/0365506 A1* | 12/2016 | Ahn | ............ | H01L 43/08 |

OTHER PUBLICATIONS

Low-power MRAM for nonvolatile electronics: Electric field control and spin-orbit torques <http://ieeexplore.ieee.org/stamp/stamp.jsp?tp=&arnumber=6849352&isnumber=6849345>, May 2014.

\* cited by examiner

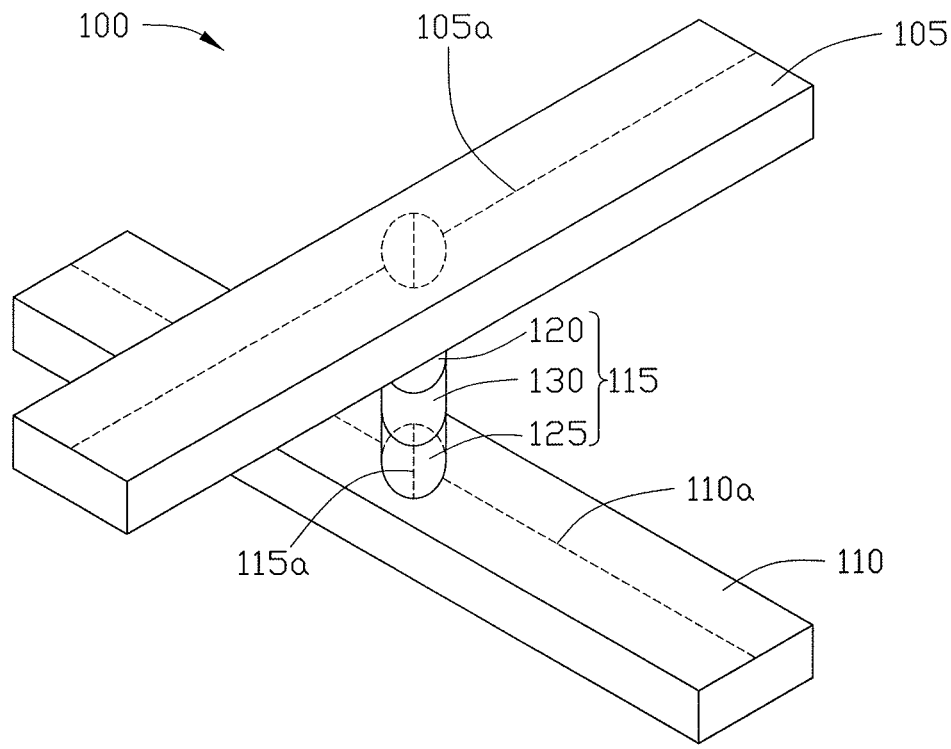
FIG. 1A
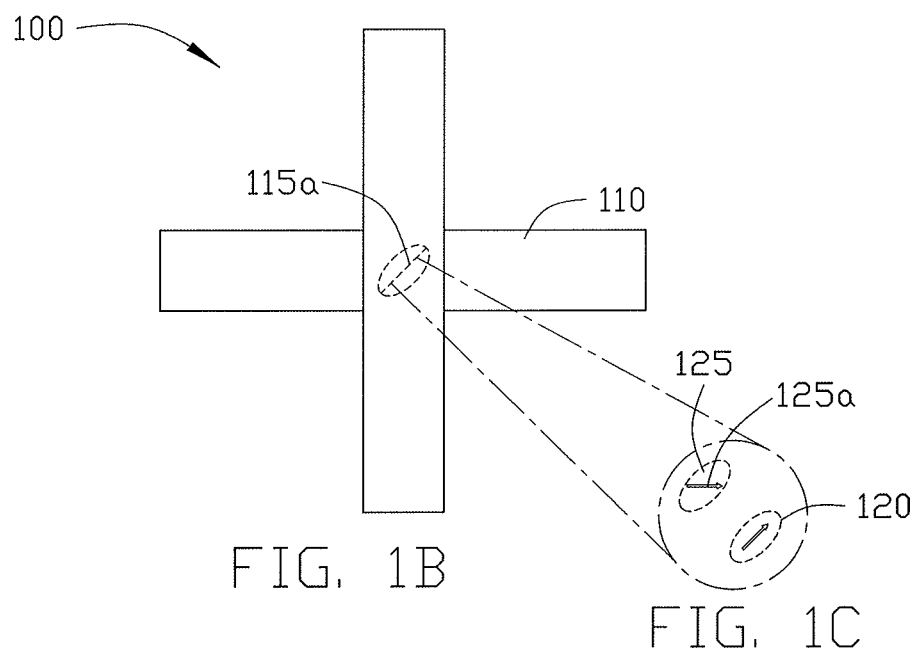
FIG. 1B
FIG. 1C

SPIN-ORBIT TORQUE BIT DESIGN FOR IMPROVED SWITCHING EFFICIENCY

BACKGROUND OF THE DISCLOSURE

Field of the Disclosure

Embodiments of the present disclosure generally relate to a non-volatile memory, more particularly, to a magnetoresistive random access memory (MRAM) with improved spin torque efficiency.

Description of the Related Art

The heart of a computer is a magnetic recording device which typically may include a rotating magnetic media or a solid state media device. A number of different memory technologies exist today for storing information for use in a computing system. These different memory technologies may, in general, be split into two major categories: volatile memory and non-volatile memory. Volatile memory may generally refer to types of computer memory that requires power to retain stored data. Non-volatile memory, on the other hand, may generally refer to types of computer memory that do not require power in order to retain stored data. Examples of non-volatile memory may include read-only memory (ROM), magnetoresistive RAM (MRAM), and flash memory, such as NOR and NAND flash, etc.

Recently, MRAM has drawn increasing attention as a next generation non-volatile memory. MRAM offers fast access time, nearly infinite read/write endurance, radiation hardness, and high storage density. Unlike conventional RAM chip technologies, MRAM data is not stored as an electric charge, but instead stores data bits using magnetic moments. MRAM devices may contain memory elements formed from two magnetically polarized layers, each of which can maintain a magnetic polarization field, separated by a thin insulating layer, which together form a magnetic tunnel junction (MTJ) bit. The thin insulating layer may be a barrier layer. MTJ memory bits can be designed for in-plane or perpendicular magnetization of the MTJ bit structure with respect to the film surface. One of the two magnetic layers is a permanent magnet (i.e., has a fixed magnetization) set to a particular polarity; the polarization of the other layer will change (i.e., has free magnetization) under the influence of an external writing mechanism such as a strong magnetic field or a spin polarized electric current. Therefore, the cells have two stable states that allow the cells to serve as non-volatile memory cells.

One type of MRAM employing the MTJ memory bit is spin-torque-transfer MRAM (STT-MRAM), in which the bit state is written using a spin polarized electric current. However, typically, a large amount of write current is required for switching the state of the cell. Over time, the barrier layer may break down due to the amount of current, rendering the MTJ inoperable. Additionally, in STT-MRAM devices, it can be difficult to isolate a single MTJ bit for writing without disturbing neighboring MTJ bits, and a large transistor may be necessary in order to select an individual MTJ bit.

Therefore, there is a need in the art for an improved MRAM device that is able to select individual MTJ bits without disturbing neighboring MTJ bits, and is also able to enhance the efficiency of the write current to prevent breakdown of the barrier layer.

SUMMARY OF THE DISCLOSURE

The present disclosure generally relates to a non-volatile memory device, and specifically, to a spin orbit torque MRAM (SOT-MRAM) memory cell which provides for a reduction in the amount of current required for switching individual bits as well as enhancement in switching reliability. The SOT-MRAM memory cell includes a first interconnect line having a first longitudinal axis, an elliptically shaped MTJ bit with a long axis, and a second interconnect line having a second longitudinal axis orientated perpendicular to the first interconnect line. The long axis of the elliptically shaped MTJ bit is disposed at an angle relative to the first longitudinal axis and the second longitudinal axis. The MTJ bit includes a magnetically polarized free layer, a barrier layer used to decouple the magnetic layers, and a magnetically polarized reference layer with a magnetic moment pinned at an angle different from the long axis of the MTJ bit. By choosing to orient both the long axis of the MTJ bit at an angle relative to the first longitudinal axis and the second longitudinal axis and the MTJ reference layer moment at an angle different than the long axis of the MTJ bit, a non-zero equilibrium angle can be induced between the free layer moment and spin currents/Rashba fields induced by some combination of voltage applied across the MTJ bit and voltage along the interconnect line, resulting in more coherent switching dynamics and decreased incubation time for reversal.

In one embodiment, a memory cell includes a first interconnect line having a first longitudinal axis, a second interconnect line having a second longitudinal axis disposed perpendicular to the first interconnect line, and an elliptically shaped bit having a long axis. The elliptically shaped bit is disposed between the first interconnect line and the second interconnect line and wherein the long axis is disposed at an angle relative to the first longitudinal axis and the second longitudinal axis. The elliptically shaped bit includes a free layer, a reference layer having a magnetic moment wherein the magnetic moment is disposed at an angle different from the long axis, and a barrier layer disposed between the free layer and the reference layer.

In another embodiment, a memory cell includes an interconnect line having a first longitudinal axis, an individual contact disposed perpendicular to the interconnect line, an elliptically shaped bit coupled to the interconnect line, wherein the elliptically shaped bit has a long axis, the long axis disposed at an angle relative to the first longitudinal axis, and wherein the elliptically shaped bit includes, a free layer, a reference layer having a magnetic moment disposed at an angle different from the long axis, and a barrier layer disposed between the free layer and the reference layer.

In another embodiment, a memory array includes a first interconnect line having a first longitudinal axis, a second interconnect line having a second longitudinal axis perpendicular to the first interconnect line, a third interconnect line having a third longitudinal axis parallel to the first interconnect line, a first elliptically shaped bit having a first long axis, and a second elliptically shaped bit having a second long axis. The first elliptically shaped bit is disposed between the first interconnect line and the second interconnect line and wherein the first long axis is disposed at an angle relative to the first longitudinal axis and the second longitudinal axis. The first elliptically shaped bit includes a first free layer, a first reference layer having a first magnetic moment wherein the first magnetic moment is disposed at an angle different from the first long axis, and a first barrier layer disposed between the first free layer and the first reference layer. The second elliptically shaped bit is disposed between the second interconnect line and the third interconnect line and wherein the second long axis is disposed at an angle relative to the second longitudinal axis and third longitudinal axis. The second elliptically shaped bit includes a second free layer, a second reference layer having a second magnetic moment wherein the second magnetic moment is disposed at an angle different from the second long axis, and a second barrier layer disposed between the second free layer and the second reference layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A is a schematic illustration of a SOT-MRAM memory cell according to one embodiment.

FIG. 1B is a schematic top planar view of the SOT-MRAM memory cell of FIG. 1A.

FIG. 1C is a schematic view of the free and reference layers of the SOT-MRAM memory cell according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1D:
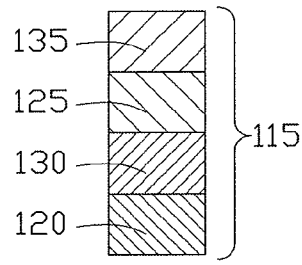
FIG. 1D is a schematic side view of the memory bit according to one embodiment.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a non-volatile memory device, and specifically, to a spin orbit torque MRAM (SOT-MRAM) memory cell which provides for a reduction in the amount of current required for switching individual bits as well as enhancement in switching reliability. The SOT-MRAM memory cell includes a first interconnect line having a first longitudinal axis, an elliptically shaped MTJ bit with a long axis, and a second interconnect line having a second longitudinal axis orientated perpendicular to the first interconnect line. The long axis of the elliptically shaped MTJ bit is disposed at an angle relative to the first longitudinal axis and the second longitudinal axis. The MTJ bit includes a magnetically polarized free layer, a barrier layer used to decouple the magnetic layers, and a magnetically polarized reference layer with a magnetic moment pinned at an angle different from the long axis of the MTJ bit. By choosing to orient both the long axis of the MTJ bit at an angle relative to the first longitudinal axis and the second longitudinal axis and the MTJ reference layer moment at an angle different than the long axis of the MTJ bit, a non-zero equilibrium angle can be induced between the free layer moment and spin currents/Rashba fields induced by some combination of voltage applied across the MTJ bit and voltage along the interconnect line, resulting in more coherent switching dynamics and decreased incubation time for reversal.

FIG. 1A is a schematic illustration of a SOT-MRAM memory cell 100, according to one embodiment. The memory cell 100 may be a spin-hall-effect-based MRAM (SHE-MRAM) or Rashba effect MRAM. The memory cell 100 has a first interconnect line 105 having a first longitudinal axis 105a, a second interconnect line 110 having a second longitudinal axis 110a perpendicular to the first interconnect line 105, and an elliptically shaped bit 115 having a long axis 115a disposed at an angle relative to the first longitudinal axis 105a and the second longitudinal axis 110a. The magnetic tunnel junction memory element or elliptically shaped bit 115 comprises a free layer 120, having a free magnetization, a reference layer 125, having a fixed or pinned magnetic moment 125a, and a barrier layer 130 used to decouple the magnetic layers disposed between the free layer 120 and the reference layer 125. The magnetic moment 125a of the reference layer 125 is disposed at an angle different from the long axis 115a. It is to be understood that additional layers may be present between the free layer 120 and the respective interconnect line 105, 110 as well as between the reference layer 125 and the respective interconnect line 105, 110. For example, an antiferromagnetic layer, a synthetic antiferromagnetic structure or a capping layer may be present.

The elliptically shaped bit 115 is an elliptical cylinder with a height, long diameter, and short diameter, wherein the long diameter is greater than the short diameter. The long diameter of the elliptically shaped bit 115 is equivalent to the long axis 115a. In one embodiment, the long axis 115a is the same as the widths of both the first interconnect line 105 and the second interconnect line 110. In one embodiment, the long axis 115a of the elliptically shaped bit 115 is oriented 5-60 degrees from the second longitudinal axis 110a. In one embodiment, the long axis 115a of the elliptically shaped bit 115 is oriented between 30 degrees and 85 degrees from the first longitudinal axis 105a. In one embodiment, the bit may be oriented such that the free layer 120 is contacting the second interconnect 110 at an angle between 5 degrees and 60 degrees from the second longitudinal axis 110a. In another embodiment, the bit may be oriented such that the free layer 120 is contacting the first interconnect 105 at an angle between 5 degrees and 60 degrees from the first longitudinal axis 105a. In one embodiment, the long axis 115a is disposed at an angle between 5 degrees and 60 degrees from the first longitudinal axis 105a.

The elliptically shaped bit 115 is patterned to give the elliptically shaped bit 115 an uniaxial anisotropy along the long axis 115a, ensuring the free layer 120 will only point in one of two directions along the long axis 115a. As a result of the patterned shape, an uniaxial anisotropy energy well naturally forms creating a barrier to prevent the free layer 120 from spontaneously switching, ensuring retention. The uniaxial anisotropy energy is determined by the formula $1/2 M_s H_k V$, where $M_s$ is saturation magnetization, $H_k$ is anisotropy field, and V is volume. Writing occurs by passing a spin polarized current through the free layer 120. The spin polarized current exerts a torque on the free layer 120 allowing the free layer 120 to overcome the anisotropy energy barrier and switch orientation. Spin hall effects and/or Rashba effects generated by passing a current through the interconnect 105 coupled to the free layer may help enhance the writability of individual bits including elliptically shaped bit 115. Rashba effects, only spin hall effects, or a combination of both Rashba effects and spin hall effects may be chosen to enhance the writability of individual bits. An individual memory cell can be written upon without disturbing neighboring memory cells. Additionally, Rashba and/or spin hall effects in neighboring memory cells may be suppressed to ensure only the selected memory cell is written, otherwise known as a half-select scheme. It is understood that the reverse case may also occur, i.e. that spin hall effects and/or Rashba effects may be the main writing mechanism with spin polarized current flowing through the MTJ bit helping to enhance writability and ensure proper bit selection.

FIG. 1B is a schematic top planar view of the SOT-MRAM memory cell 100 of FIG. 1A showing the disposition of the elliptically shaped bit 115 at some angle relative to the first interconnect line 105 and the second interconnect line 110. In other systems, the pinning of the reference layer 125 is done parallel to the long axis 115a of the elliptically shaped bit 115 so that the spin polarization of the current interacting with the free layer 120 is collinear to the magnetization. Because the strength of the spin torque required to switch the free layer 120 is proportional to the sine of the angle between the free and reference layer moments, a collinear orientation of the free layer 120 and reference layer 125, where the angle between the layers is 0 degrees or 180 degrees, results in the sine, and thus the spin torque, being zero. Therefore, switching requires thermal fluctuations of the magnetic moments to induce a small misalignment between the layers, so that as current begins to flow through the free layer 120, the free layer 120 begins to oscillate gaining amplitude until the oscillation is large enough to overcome the anisotropy energy barrier allowing the free layer 125 to switch orientation. As these thermal fluctuations are a random process, the initial time needed to begin precessing (known as incubation time) and thus the total switching time for an individual bit, as well as the entire bit array, can vary from one write attempt to the next.

As FIG. 1C illustrates, by pinning the magnetic moment 125a of the reference layer 125 at an angle different than long axis 115a, the initial state for exerting spin torque on the free layer 120 is starting from an amount greater than zero, which eliminates the incubation time and greatly enhances the switching efficiency and coherency. In one embodiment, the magnetic moment 125a of the reference layer 125 is disposed at an angle 5-60 degrees away from the long axis 115a of the elliptically shaped bit 115.

The reference layer 125 may be simple pinned by using an antiferromagnetic layer such as Iridium-Manganese (IrMn), Platinum-Manganese (PtMn), Nickel-Manganese (NiMn), Nickel Oxide (NiO), or Iron-Manganese (FeMn). In one embodiment, the elliptically shaped bit 115 may use a synthetic antiferromagnet (SAF) fixed layer with two magnetic layers coupled through a nonmagnetic layer. In certain embodiments, the fixed ferromagnet layer may be a single ferromagnet comprising Nickel (Ni), Iron (Fe), Cobalt (Co) or an alloy comprising a combination thereof together with Boron (B), Germanium (Ge), Platinum (Pt), and/or Manganese (Mn), or superlattices of Cobalt (Co) and Pt, Co and Palladium (Pd), Co and Ni, and/or combinations and mixtures thereof. In certain embodiments, the nonmagnetic layer comprises Ruthenium (Ru). In certain embodiments the SAF comprises a first ferromagnet layer, a second ferromagnet layer, and a Ru layer disposed between the first ferromagnet layer and the second ferromagnet layer.

In certain embodiments the elliptically shaped bit 115 could include a bottom seeding underlayer, a pinning layer, and/or a capping layer. FIG. 1D shows the side view of one embodiment of the elliptically shaped bit 115. The elliptically shaped bit 115 includes an antiferromagnetic layer 135, a reference layer 125, a barrier layer 130, and a free layer 120. The elliptically shaped bit 115 is disposed between the first interconnect line 105 and second interconnect line 110, not shown. The antiferromagnetic layer 135 is coupled to the reference layer 125 and may be coupled to either the first interconnect line 105 or the second interconnect line 110. The barrier layer 130 is disposed between the reference layer 125 and the free layer 120.

Figure 1E:
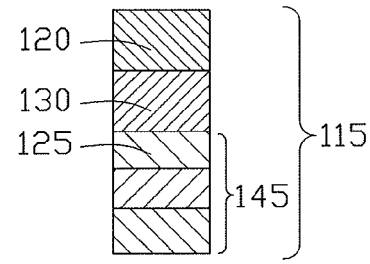
FIG. 1E is a schematic side view of the memory bit according to another embodiment.

FIG. 1E shows the side view of another embodiment of the elliptically shaped bit 115. The elliptically shaped bit 115 includes a synthetic antiferromagnetic layer 145, a barrier layer 130, and a free layer 120. The synthetic antiferromagnetic layer 145 includes the reference layer 125. In certain embodiments the SAF comprises a first ferromagnet layer, a second ferromagnet layer, and a ruthenium (Ru) layer disposed between the first ferromagnet layer and the second ferromagnet layer. The ferromagnet layer adjacent to the barrier layer 130 is the reference layer 125. The elliptically shaped bit 115 is disposed between the first interconnect line 105 and second interconnect line 110, not shown. The synthetic antiferromagnetic layer 145 may be coupled to either the first interconnect line 105 or the second interconnect line 110. The barrier layer 130 is disposed between the reference layer 125 and the free layer 120.

Figure 1F:
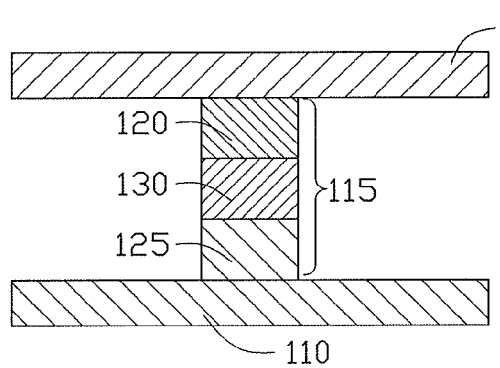
FIG. 1F is a schematic side view of the SOT-MRAM memory cell according to one embodiment.

FIG. 1F shows the side view of one embodiment of the SOT-MRAM memory cell 100. The elliptically shaped bit 115 includes the free layer 120 coupled to the first interconnect line 105 and the reference layer 125 disposed directly on the second interconnect line 110. The free layer 120 and the reference layer 125 may comprise Nickel (Ni), Iron (Fe), Copper (Cu), or an alloy combination thereof together with Boron (B), Germanium (Ge), and/or Manganese (Mn). The free layer 120 may have a thickness of about 1 nm-6 nm and the reference layer 125 may have a thickness of about 1 nm-6 nm. The barrier layer 130 is disposed between the free layer 120 and the reference layer 125. The barrier layer 130 may be comprised of an oxide, such as magnesium oxide (MgO), hafnium oxide (HfO), or aluminum oxide (AlOx), and may have a thickness of about 0.7 nm-3 nm. The interconnect line coupled to the free layer (first interconnect 105 in FIG. 1F) may be comprised of a material with strong spin orbit coupling such as Platinum (Pt), Tantalum (Ta), Tungsten (W), Hafnium (Hf), Iridium (Ir), Copper-Bismuth (CuBi), Copper-Iridium (CuIr), or Aluminum-Tungsten (AuW) with a thickness of about 4-20 nm in order to generate spin hall and/or Rashba effects and the second interconnect line 110 coupled to the reference layer 125 may be comprised of copper or aluminum, and may have a thickness of about 20 nm-100 nm.

Figure 1G:
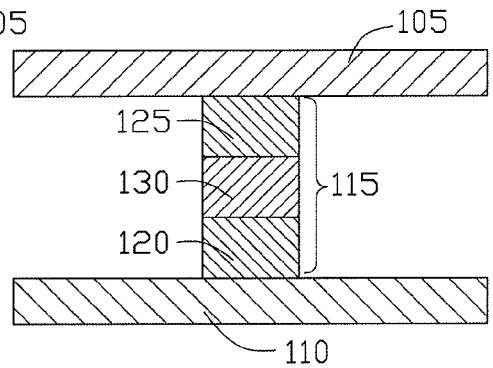
FIG. 1G is a schematic side view of the SOT-MRAM memory cell according to another embodiment.

FIG. 1G illustrates another embodiment of the SOT-MRAM memory cell 100 where the elliptically shaped bit 115 includes the reference layer 125 coupled to the first interconnect line 105 and free layer 120 disposed directly on the second interconnect line 110. The first interconnect line 105 and the second interconnect line 110 may be a word line and a bit line for read operations. The first interconnect line 105 and the second interconnect line 110 may be a word line and a bit line for write operations. The barrier layer 130 is disposed between the free layer 120 and the reference layer 125.

Figure 1H:
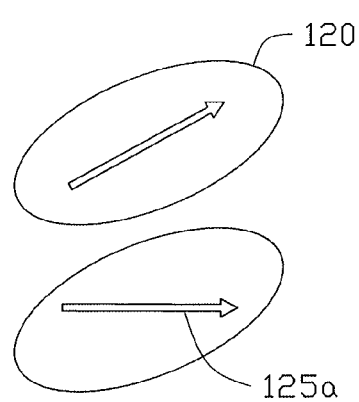
FIG. 1H is a schematic view of the SOT-MRAM memory cell's state according to one embodiment.
Figure 1I:
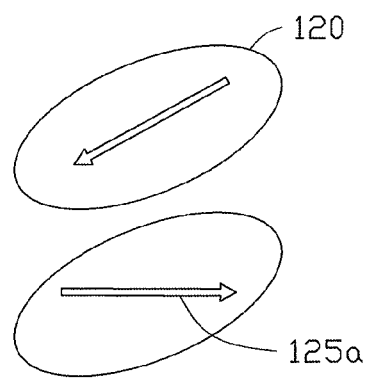
FIG. 1I is a schematic view of the SOT-MRAM memory cell's state according to another embodiment.

The elliptically shaped bit 115 may be in a state representing either 1 or 0, where the component of the free layer moment 120 is either substantially antiparallel or parallel to the reference layer moment 125*a* respectively. The resistance of the bit 115 depends on the relative orientation of the magnetic moments of the free layer 120 and reference layer 125 interfacing with the barrier layer 130. When the magnetic moment of the free layer 120 is in a substantially parallel configuration with the reference moment 125*a*, as seen in FIG. 1H, the elliptically shaped bit 115 is in a state representing 0. When the component of the free layer moment 120 is in a substantially antiparallel configuration with the reference moment 125*a*, as seen in FIG. 1I, the elliptically shaped bit 115 is in a state representing 1.

Figure 2A:
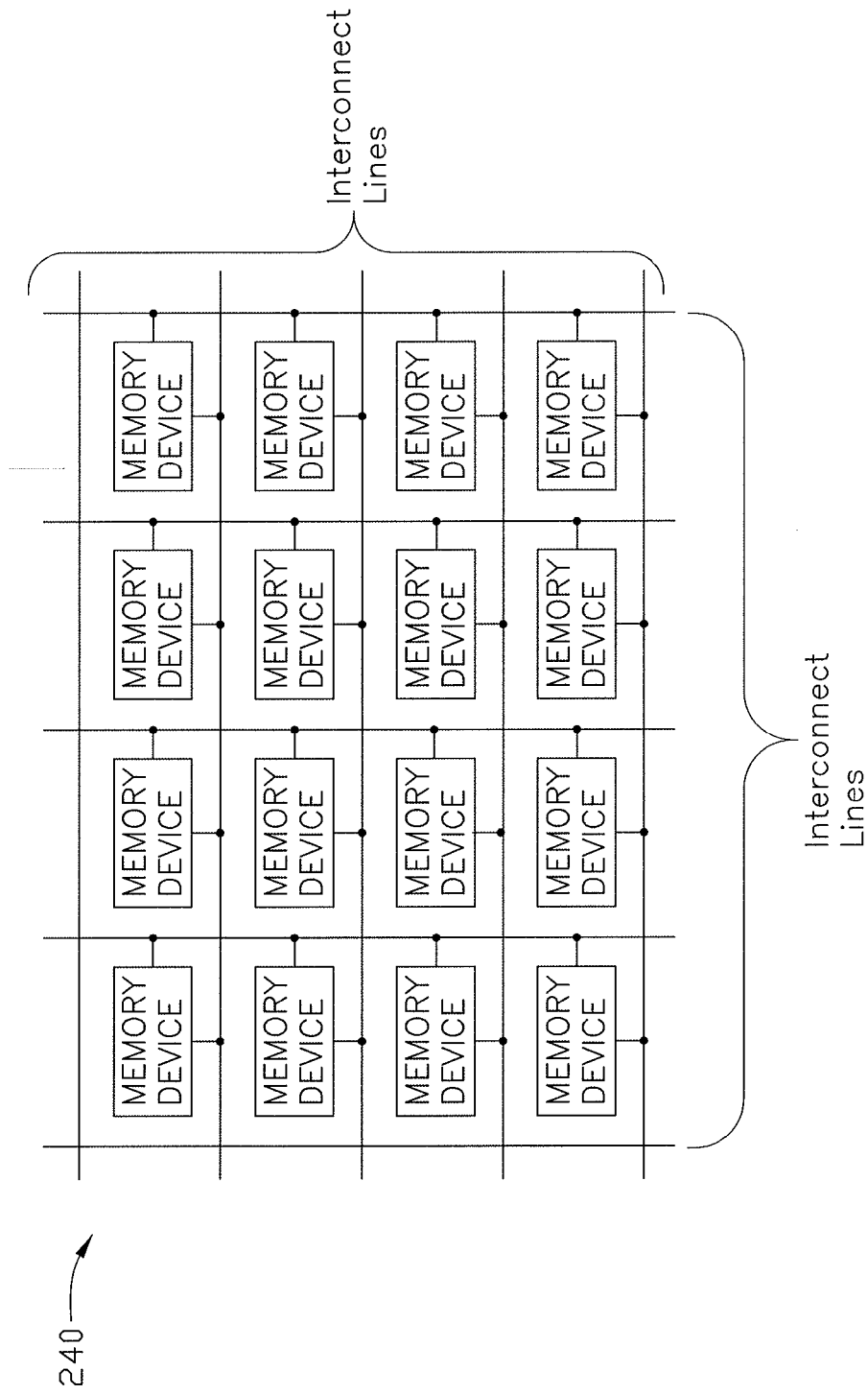
FIG. 2A is a schematic diagram of a memory array according to one embodiment.
Figure 2B:
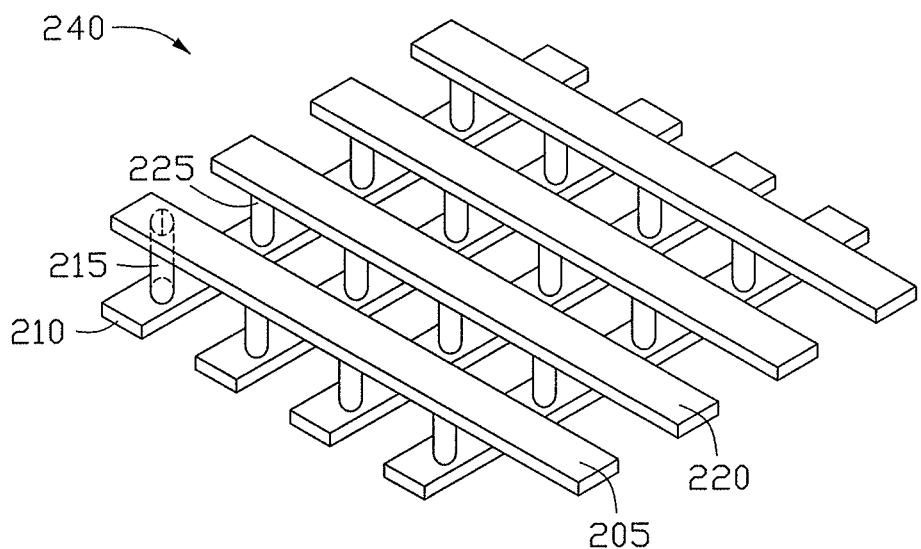
FIG. 2B is a schematic perspective view of a SOT-MRAM memory array according to one embodiment.

FIG. 2A illustrates a memory array 240, according to one embodiment. The memory array 240 is comprised of a plurality of bottom interconnect lines, a plurality of top interconnect lines disposed perpendicular to the top interconnect lines, and a plurality of elliptically shaped bits disposed in between the plurality of bottom interconnect lines and the plurality of top interconnect lines. According to one example, in FIG. 2B a memory array 240 includes a first interconnect line 205, a second interconnect line 210 disposed perpendicular to the first interconnect line 205, a third interconnect line 220 disposed parallel to the first interconnect line 205, a first elliptically shaped bit 215 having a first long axis, and a second elliptically shaped bit 225 having a second long axis. Although not shown, it can be understood that the first elliptically shaped bit 215 has a similar disposition to elliptically shaped bit 115. The first elliptically shaped bit 215 is disposed between the first interconnect line 205 and the second interconnect line 210. The first elliptically shaped bit 215 includes a first free layer, a first reference layer having a first magnetic moment disposed at an angle different from the first long axis, and a first barrier layer disposed between the first free layer and the first reference layer. The second elliptically shaped bit 225 is disposed between the second interconnect line 210 and the third interconnect line 220. The second elliptically shaped bit 225 includes a second free layer, a second reference layer having a second magnetic moment disposed at an angle different from the second long axis, and a second barrier layer disposed between the second free layer and the second reference layer. The second long axis of the second elliptically shaped bit 225 can be parallel to the first long axis of the first elliptically shaped bit 215. A possible alternative exists where the second long axis of the second elliptically shaped bit 225 is at an angle different from the angle of the first long axis of the first elliptically shaped bit 225. It can be imagined that the memory array 240 may contain a plurality of elliptically shaped bits where the long axis of each individual bit in the memory array 240 is disposed at a different angle with respect to the long axes of the elliptically shaped bits of the rest of the array.

Figures 3A, 3B:
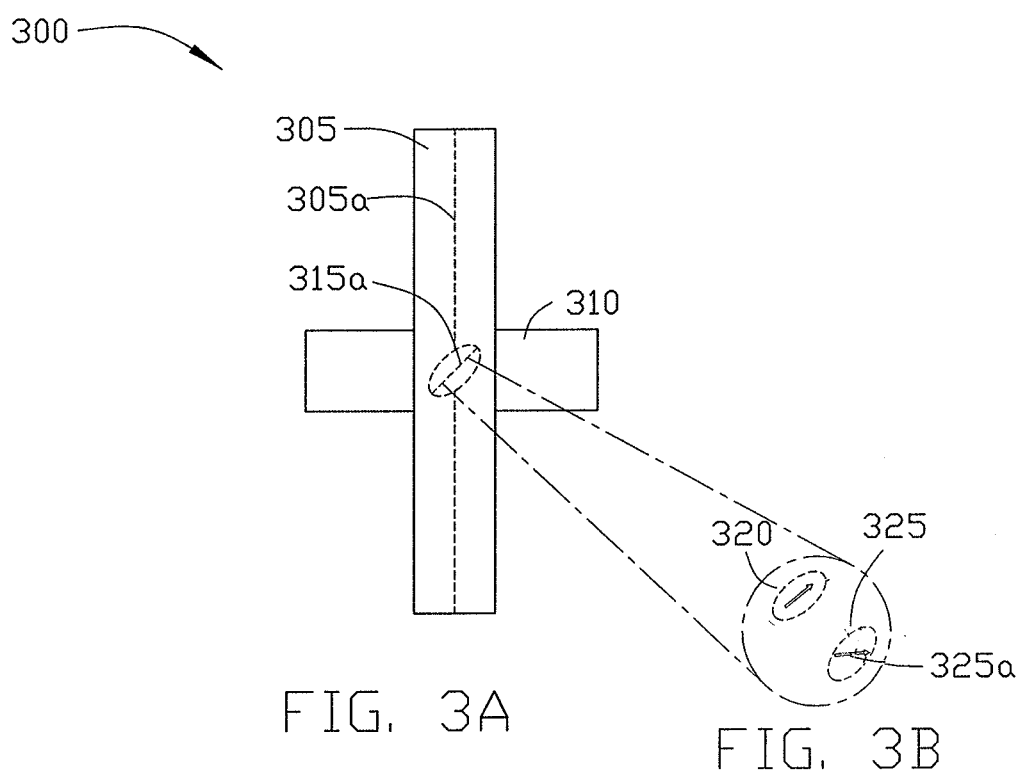
FIG. 3A is a schematic planar view of the SOT-MRAM memory cell.
FIG. 3B is a schematic view of the reference layer and free layer of the SOT-MRAM memory cell of FIG. 3A.

FIG. 3A illustrates another embodiment of a SOT-MRAM memory cell 300 where the memory cell 300 comprises an interconnect line 305 having a first longitudinal axis 305*a*, an elliptically shaped bit 315 having a long axis 315*a* coupled to the interconnect line 305, and an individual contact 310 disposed perpendicular to the interconnect line 305. It can be understood that the individual contact 310 can utilize a select transistor, a non-select transistor, or a combination of the two. The elliptically shaped bit 315 may be disposed between the interconnect line 305 and the individual contact 310. The long axis 315*a* is disposed at an angle relative to the first longitudinal axis 305*a*. The individual contact 310 may have a second longitudinal axis, not shown. In another embodiment, the long axis 315*a* is disposed at an angle relative to the first longitudinal axis 305*a* and the second longitudinal axis.

The pinning of the reference layer 325 can be understood to utilize the same techniques utilized to pin the reference layer 125. As FIG. 3B illustrates, the magnetic moment 325*a* of the reference layer 325 is pinned at an angle different from the free layer 320.

Figure 3C:
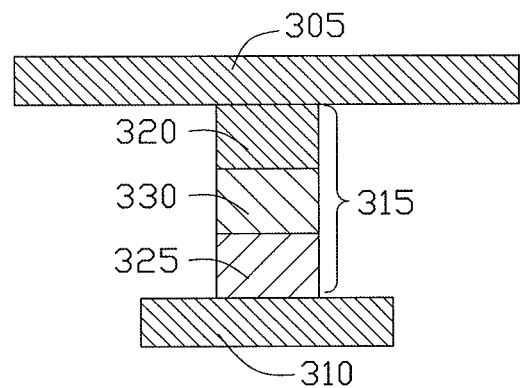
FIG. 3C is a schematic side view of the SOT-MRAM memory cell according to one embodiment.

FIG. 3C illustrates the side view of one embodiment of the SOT-MRAM memory cell 300. The elliptically shaped bit 315 includes the free layer 320 coupled to the interconnect line 305 and the reference layer 325 disposed directly on the individual contact 310. The free layer 320 and the reference layer 325 may comprise Nickel (Ni), Iron (Fe), Copper (Cu), or an alloy combination thereof together with Boron (B), Germanium (Ge), and/or Manganese (Mn). The free layer 320 may have a thickness of about 1 nm-6 nm and the reference layer 325 may have a thickness of about 1 nm-6 nm. The barrier layer 330 is disposed between the free layer 320 and the reference layer 325. The barrier layer 330 may be comprised of an oxide, such as magnesium oxide (MgO), hafnium oxide (HfO), or aluminum oxide (AlOx) and may have a thickness of about 0.7 nm-3 nm. The first interconnect line 305 maybe comprised of a material with strong spin orbit coupling such as Platinum (Pt), Tantalum (Ta), Tungsten (W), Hafnium (Hf), Iridium (Ir), Copper-Bismuth (CuBi), Copper-Iridium (CuIr), or Aluminum-Tungsten (AuW) with a thickness of about 4-20 nm in order to generate spin hall and/or Rashba effects.

Figure 3D:
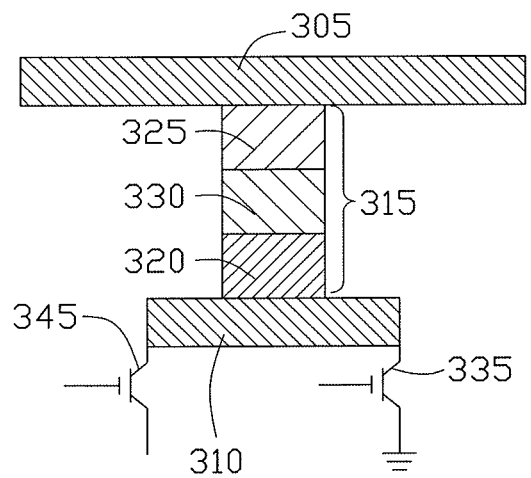
FIG. 3D is a schematic side view of the SOT-MRAM memory cell according to one embodiment.
Figure 3E:
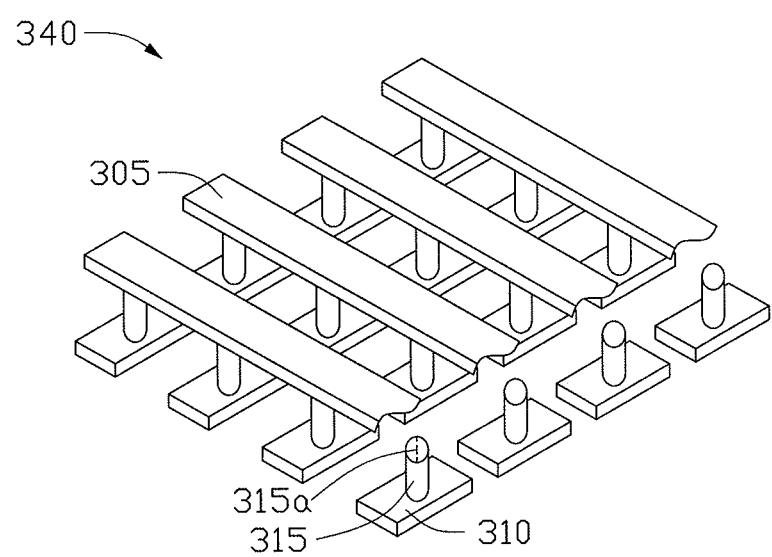
FIG. 3E is a schematic illustration of a SOT-MRAM memory array according to another embodiment.

FIG. 3D illustrates another embodiment of the SOT-MRAM memory device 300 where the elliptically shaped bit 315 includes the reference layer 325 coupled to the interconnect line 305 and the free layer 320 disposed directly on the individual contact 310. The individual contact 310 coupled to the free layer 320 may be comprised of a material with strong spin orbit coupling such as Pt, Ta, W, Hf, Ir, CuBi, CuIr, or AuW with a thickness of about 4-20 nm in order to generate spin hall and/or Rashba effects and the second interconnect line 305 coupled to the reference layer 325 may be comprised of copper or aluminum, and may have a thickness of about 20 nm-100 nm. The barrier layer 330 is disposed between the free layer 320 and the reference layer 325. The individual contact 310 may be coupled to two select transistors 335, 345 disposed on opposite sides of the bit 315. The interconnect line 305 may contact one or more rows of bits. The individual contact 310 may contact a single bit. As such, the present disclosure may include an array of cells with independent contacts, as seen in FIG. 3E. It may be understood that the elliptically shaped bit 315 may include the various embodiments of the elliptically shaped bit 115. As way of example, elliptically shaped bit 315 may include one or more of the following: a capping layer, an underlayer, and/or a pinning layer.

FIG. 3E illustrates a memory array 340, according to one embodiment. The memory array 340 is comprised of a plurality of interconnect lines, a plurality independent contacts disposed perpendicular to the plurality of interconnect lines, and a plurality of elliptically shaped bits coupled to the plurality of interconnect lines and the plurality of individual contacts. According to one example, a memory array 340 includes an interconnect line 305, an individual contact 310 disposed perpendicular to the first interconnect line 305, and an elliptically shaped bit 315 having a long axis 315a. The interconnect line 305 has been partially removed to show the individual contact 310. The elliptically shaped bit 315 includes a free layer, a reference layer having a magnetic moment disposed at an angle different from the long axis, and a barrier layer disposed between the free layer and the reference layer. It should be understood, that the elliptically shaped bit 315 may be similar to the elliptically shaped bit 115 as described in FIG. 1D and FIG. 1E. It can be imagined that the memory array 340 may contain a plurality of elliptically shaped bits where the long axis of each individual bit in the memory array 340 is disposed at a different angle with respect to the long axes of the elliptically shaped bits of the rest of the array.

Therefore, by patterning a bit to give it a uniaxial anisotropy, ensuring a free layer will only point in one of two directions, disposing of the elliptically shaped bit at an angle relative to a first interconnect and second interconnect, and disposing a magnetic moment of a reference layer at a different angle from the long axis, the switching of the free layer may be enhanced allowing for faster and more cohesive writing and reading times of select memory cells without disturbing neighboring memory cells.

While the foregoing is directed to embodiments of the present disclosure, other and further embodiments of the disclosure may be devised without departing from the basic scope thereof, and the scope thereof is determined by the claims that follow.

What is claimed is:

1. A memory cell, comprising:
a first interconnect line having a first longitudinal axis;
a second interconnect line having a second longitudinal axis disposed perpendicular to the first interconnect line; and
an elliptically shaped bit having a long axis disposed between the first interconnect line and the second interconnect line, wherein the long axis is disposed at an angle relative to the first longitudinal axis and the second longitudinal axis, and wherein the elliptically shaped bit comprises:
a free layer;
a reference layer having a magnetic moment, wherein the magnetic moment is disposed at an angle different from the long axis; and
a barrier layer disposed between the free layer and the reference layer.

2. The memory cell of claim 1, wherein the barrier layer comprises an oxide material, the oxide material comprising one or more of: magnesium oxide (MgO), hafnium oxide (HfO), and aluminum oxide (AlOx).

3. The memory cell of claim 1, wherein the elliptically shaped bit is spin-hall-effect-based magnetoresistive random access memory.

4. The memory cell of claim 1, wherein the elliptically shaped bit is Rashba-effect-based magnetoresistive random access memory.

5. The memory cell of claim 1, wherein the free layer is coupled to the first interconnect line.

6. The memory cell of claim 1, wherein the first interconnect line comprises one or more of Platinum (Pt), Tantalum (Ta), Tungsten (W), Hafnium (Hf), Iridium (Ir), Copper-Bismuth (CuBi), Copper-Iridium (CuIr), and Aluminum-Tungsten (AuW), and wherein the first interconnect line has a thickness of about 4 nm to 20 nm.

7. The memory cell of claim 1, wherein the first interconnect line comprises one or more of copper and aluminum, and wherein the first interconnect line has a thickness of about 20 nm to 100 nm.

8. The memory cell of claim 1, wherein the reference layer is coupled to the first interconnect line.

9. The memory cell of claim 1, wherein the long axis is disposed at an angle between 5 degrees and 60 degrees from the first longitudinal axis.

10. A memory cell, comprising:
an interconnect line having a first longitudinal axis; and
an elliptically shaped bit coupled to the interconnect line, wherein the elliptically shaped bit has a long axis, the long axis disposed at an angle between about 5 degrees and about 60 degrees relative to the first longitudinal axis, and wherein the elliptically shaped bit comprises:
a free layer;
a reference layer having a magnetic moment; and
a barrier layer disposed between the free layer and the reference layer.

11. The memory cell of claim 10, wherein the elliptically shaped bit further comprises a capping layer.

12. The memory cell of claim 10, wherein the elliptically shaped bit further comprises a pinning layer.

13. The memory cell of claim 12, wherein the pinning layer is an antiferromagnet (AFM).

14. The memory cell of claim 12, wherein the pinning layer comprises one or more of Iridium-Manganese (IrMn), Platinum-Manganese (PtMn), Nickel-Manganese (NiMn), Nickel Oxide (NiO), and Iron-Manganese (FeMn).

15. The memory cell of claim 10, wherein the reference layer is part of a synthetic antiferromagnet structure.

16. The memory cell of claim 15, wherein the synthetic antiferromagnet structure comprises a first ferromagnet layer adjacent to the barrier layer, a second ferromagnet layer, and a ruthenium layer disposed between the first ferromagnet layer and the second ferromagnet layer, and wherein the reference layer is the first ferromagnet layer.

17. The memory cell of claim 10, wherein the free layer is coupled to the interconnect line.

18. The memory cell of claim 10, wherein the free layer is coupled to the individual contact.

19. The memory cell of claim 10, wherein the individual contact comprises one or more of Platinum (Pt), Tantalum (Ta), Tungsten (W), Hafnium (Hf), Iridium (Ir), Copper-Bismuth (CuBi), Copper-Iridium (CuIr), and Aluminum-Tungsten (AuW), and wherein the individual contact has a thickness of about 4 nm to 20 nm.

20. A memory array, comprising:
a first interconnect line having a first longitudinal axis;
a second interconnect line having a second longitudinal axis perpendicular to the first interconnect line;
a third interconnect line having a third longitudinal axis parallel to the first interconnect line;
a first elliptically shaped bit having a first long axis disposed between the first interconnect line and the second interconnect line, wherein the first long axis is disposed at an angle relative to the first longitudinal axis and the second longitudinal axis, and wherein the first elliptically shaped bit comprises:
a first free layer;
a first reference layer having a first magnetic moment disposed at an angle different from the first long axis; and
a first barrier layer disposed between the first free layer and the first reference layer; and
a second elliptically shaped bit having a second long axis disposed between the second interconnect line and the third interconnect line, wherein the second long axis is disposed at an angle relative to the second longitudinal axis and the third longitudinal axis, and wherein the second elliptically shaped bit comprises:
a second free layer;
a second reference layer having a second magnetic moment disposed at an angle different from the second long axis; and
a second barrier layer disposed between the second free layer and the second reference layer.

21. The memory array of claim 20, wherein the memory array is a spin-hall-effect-based magnetoresistive random access memory array.

22. The memory array of claim 20, wherein the memory array is a Rashba-effect-based magnetoresistive random access memory array.

23. The memory array of claim 20, wherein the first free layer is coupled to the first interconnect line.

24. The memory array of claim 23, wherein the first interconnect line comprises one or more of Platinum (Pt), Tantalum (Ta), Tungsten (W), Hafnium (Hf), Iridium (Ir), Copper-Bismuth (CuBi), Copper-Iridium (CuIr), and Aluminum-Tungsten (AuW), and wherein the first interconnect line has a thickness of about 4 nm to 20 nm.

* * * * *